(12) United States Patent
Bröms et al.

(10) Patent No.: US 6,982,895 B2
(45) Date of Patent: Jan. 3, 2006

(54) METHOD FOR READING A PASSIVE MATRIX-ADDRESSABLE DEVICE AND A DEVICE FOR PERFORMING THE METHOD

(75) Inventors: Per Bröms, Linkoping (SE); Christer Karlsson, Linkoping (SE)

(73) Assignee: Thin Film Electronics ASA, Oslo (NO)

( * ) Notice: Subject to any disclaimer, the term of this patent is extended or adjusted under 35 U.S.C. 154(b) by 143 days.

(21) Appl. No.: 10/289,419

(22) Filed: Nov. 7, 2002

(65) Prior Publication Data

US 2003/0103386 A1 Jun. 5, 2003

(30) Foreign Application Priority Data

Nov. 30, 2001 (NO) .......................................... 2001 5879

(51) Int. Cl.
| | | |
|---|---|---|
| G11C 11/22 | (2006.01) | |
| G11C 7/12 | (2006.01) | |
| G11C 7/22 | (2006.01) | |
| G11C 8/08 | (2006.01) | |
| G11C 8/18 | (2006.01) | |

(52) U.S. Cl. .................. 365/145; 365/220; 365/189.11; 365/230.06; 365/233

(58) Field of Classification Search ................. 365/145, 365/189.01, 220, 189.11, 230.06, 233
See application file for complete search history.

(56) References Cited

U.S. PATENT DOCUMENTS

| | | | | |
|---|---|---|---|---|
| 4,873,455 A | * | 10/1989 | de Chambost et al. | ....... 706/33 |
| 5,550,770 A | * | 8/1996 | Kuroda | ........................ 365/145 |
| 6,466,473 B2 | * | 10/2002 | Nair et al. | .................. 365/145 |
| 6,522,568 B1 | * | 2/2003 | Nair | ........................... 365/145 |

OTHER PUBLICATIONS

Proceedings of the IEEE, vol. 88, No. 5, May 2000, pp. 667–689, "Survey of Circuit Innovation in Ferroelectric Random–Access Memories" by A. Sheikholeslami et al.

* cited by examiner

Primary Examiner—Richard Elms
Assistant Examiner—J. H. Hur
(74) Attorney, Agent, or Firm—Birch, Stewart, Kolasch & Birch, LLP

(57) ABSTRACT

A passive matrix-addressable device may include individually addressable cells of a polarizable material. The cells store data in one of two polarization states in each cell, and the polarization states in the cells are written and read by addressing via electrodes which form word and bit lines. The cells are provided in or at the crossings between the word and bit lines and a voltage pulse protocol is used read and write data to cells. During reading, a word line is activated by applying voltage which relative to the potential on all crossing bit lines corresponds to the voltage $V_s$ and data stored in the cells connected to this active word line are determined by detecting the charge values of the cells.

20 Claims, 3 Drawing Sheets

Figure 1:
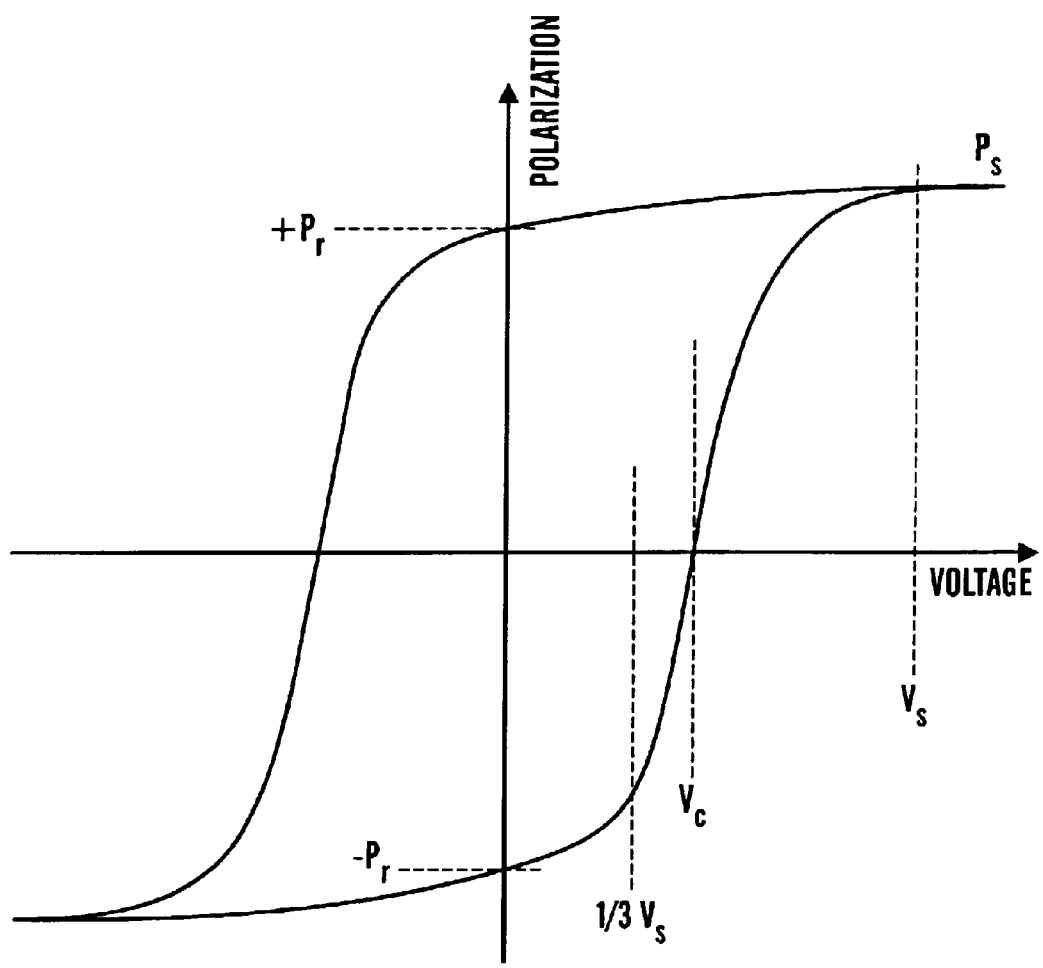

METHOD FOR READING A PASSIVE MATRIX-ADDRESSABLE DEVICE AND A DEVICE FOR PERFORMING THE METHOD

The present invention concerns a method for reading a passive matrix-addressable device, particularly a memory device or a sensor device with individually addressable cells, for storing a logical value as given by charge value set in a cell, wherein the device comprises electrically polarizable material exhibiting hysteresis, particularly a ferroelectric material, wherein the device comprises a first and a second electrode set with parallel electrodes which respectively form word lines and bit lines in the device, wherein the word line electrodes and the bit line electrodes are provided mutually orthogonal and contacting the polarizable material at opposite surfaces thereof, such that the cells of the device comprise capacitor-like structures defined in a volume of the polarizable material in or at the crossings between word lines and bit lines, wherein a cell in the device can be set to one of two polarization states or switched between these by applying a voltage $V_s$ larger than the coercive voltage $V_c$ of the polarizable material between a word line and a bit line addressing the cell, wherein each bit line is connected with a detection means, wherein the method comprises a voltage pulse protocol with a read cycle such that each detection means during the read cycle detects charges flowing between its associated bit line and cells connected with this bit line; as well as a device for performing the method for reading a passive matrix-addressable device, particularly a memory device or a sensor device with individually addressable cells, for storing a logical value as given by charge value set in a cell, wherein the device comprises electrically polarizable material exhibiting hysteresis, particularly a ferroelectric material, wherein the device comprises a first and a second electrode set with parallel electrodes which respectively form word lines and bit lines in the device, wherein the word line electrodes and the bit line electrodes are provided mutually orthogonal and contacting the polarizable material at opposite surfaces thereof, such that the cells of the device comprise capacitor-like structures defined in a volume of the polarizable material in or at the crossings between word lines and bit lines, wherein a cell in the device can be set to one of two polarization states or switched between these by applying a voltage $V_s$ larger than the coercive voltage $V_c$ of the polarizable material between a word line and a bit line addressing the cell, wherein each bit line is connected with a detection means, wherein the method comprises a voltage pulse protocol with a read cycle such that each detection means during the read cycle detects charges flowing between its associated bit line and cells connected with this bit line.

Particularly the present invention as mentioned above concerns a method for reading all cells connected between a selected word line and the crossing bit lines in parallel, a so-called full row read. This is known from among other U.S. Pat. No. 6,157,578 which concerns a device and method for accessing a row of data in a semiconductor memory device in one single operation, in other words, in parallel.

As an example of the state of the art concerning active matrix-addressable devices, reference can be made to A. Sheikholeslami and P. Glenn Gulak, "Survey of Circuit Innovations in Ferroelectric Random-Access Memories", Proceedings of the IEEE, volume 88, no. 5, pp. 667–689, May 2000. This paper discloses active memory devices and methods for their addressing and particularly active ferroelectric memory devices of the kind wherein each cell is realized as a capacitor-like structure connected in series with a so-called access transistor which controls the access to the capacitor. The material in the capacitor-like structure is a ferroelectric material which can be polarized and exhibits hysteresis. Such active memory cells connected with a transistor are called cells of the type 1T-1C, but may also comprise two transistors and two capacitors etc. It is also possible that a larger number n capacitors can be connected with a single transistor, such that active memory cell is denoted as a cell of the type 1T-nC. The intention is that the capacitor of the memory cell when the latter is not addressed, can be disconnected and then be uninfluenced by the matrix stray capacitance which may cause voltage disturbs and sneak currents when another cell of the matrix shall be addressed.

Matrix-addressable devices with active cells hence have obvious advantages, but also disadvantages. The use of access or switch transistors comports increased power consumption and results in a lower integration density, something which for instance reduces the storage density in memory devices.

In passive matrix-addressable memory devices all cells, e.g. the memory cells of a memory matrix, will all the time be connected in the network formed by the electrodes, usually called word lines and bit lines of the matrix, each cell being provided at or between a word line or a crossing bit line and hence forming the capacitive structure. A single passive cell of this kind is addressed by applying a voltage on the word line and/or bit line in question such that a potential difference is obtained over the memory cell between these electrodes. Depending on the value of the potential difference it will be possible to influence the polarization state of the cell, e.g. by setting a permanent positive polarization in the cell or a permanent negative polarization in the cell. By applying a sufficiently large potential difference corresponding to a voltage difference $V_s$ which must be larger than coercive voltage $V_c$ of the ferroelectric material, it will be possible to switch from one polarization state to the other.

Writing of data in a cell of this kind comprises polarizing a virgin cell, i.e. a non-polarized cell, to one of the two permanent polarization states or reversing the polarization which already has been set in the cell by switching it from a permanent positive to a permanent negative polarization state or vice versa. In reading the polarization state of the cell is detected in a corresponding manner, e.g. by setting the word line to the voltage level $V_s$ while the corresponding bit line is kept at zero potential. Dependent on the polarization state the polarization of the cell either is maintained or switched, something which respectively results in a low or high charge current on the bit line. The charge current can be detected as a current value and the logic state of the cell can e.g. be read as respectively a logic zero or logic one dependent on the polarity. This method for readout which in practice has shown to be the only one that can be performed, is destructive in the sense that it destroys the original data content stored in the cell when the polarization stated thereof is switched to the polarization state of the opposite polarity. This provides a reliable detection of the logical value, but it implies also that the original logic value as is the case must be rewritten to the cell by performing a write operation as mentioned above.

Both in writing and reading to the cell it is necessary with relatively large potential differences and in a passive matrix this in addressing operations to an individual cell causes disturb voltages and sneak currents in the passive network of the cells, such that their polarization state can be influenced. If addressing shall take place in parallel to several cells, e.g. all cells connected with a particular word line, the problem is amplified by disturbs in the passive matrix-addressable network and the problem is aggravated further by the matrices being large, e.g. with several million cells.

The object of the present invention is thus to obviate the problems caused by destructive readout of cells in a passive matrix-addressable device, and particularly the object is to eliminate disturb voltages and sneak currents which influence the non-addressed cells in the passive matrix-addressable device during a read operation. Further it is also the object to perform reading of several cells in parallel and in particular the so-called full row read, such that all cells connected to a word line can be read in parallel, but with a minimal disturb of the remaining non-addressed cells in passive matrix-addressable devices.

Finally it is also an object of the present invention to obviate corresponding problems connecting with writing to such cells in a passive matrix-addressable network and then particularly rewrite to read cells after the read operation such that the original polarization state before reading of these cells is restored or the stored logical values or data values are reset to their original values.

The above objects and other features and advantages are achieved according to the present invention with a method which is characterized by controlling electric potentials on all word and bit lines in a time-coordinated manner according to the voltage pulse protocol, said voltage pulse protocol comprising timing sequences for the electric potentials on all word and bit lines, whereby a word line at least during a part of the read cycle is activated by an applied potential which relative to the potential of all crossing bit lines at least corresponds to the voltage $V_s$ and the logical value stored in individual cells connected with the active word line determined by detecting the charge values in the detection means.

In the method according to the invention it is regarded as advantageous using sense amplifiers as detection means.

It is also regarded as advantageous that in the method according to the invention four different voltage values are used in the control of the electrical potentials, and in that connection the voltage values 0, $V_s/3$, $2V_s/3$ and $V_s$ are preferably used.

The above-mentioned objects as well as further features and advantages are also achieved according to the present invention with a device which is characterized in that the word lines and bit lines are connected with a control means which controls electrical potentials on all word and bit lines in a time-coordinated manner and implements a voltage pulse protocol comprising timing sequences for the electric potentials on all word and bit lines, said control device being adapted for activating a word line during at least a part of the read cycle, such that a potential which relative to the potential of all crossing bit lines at least corresponds to the voltage $V_s$, is applied to this word line.

In the device according to the invention it is regarded advantageous that the polarizable material is a ferroelectric polymer.

It is also regarded as advantageous that the detection means in the device according to the invention are sense amplifiers.

Figure 2:
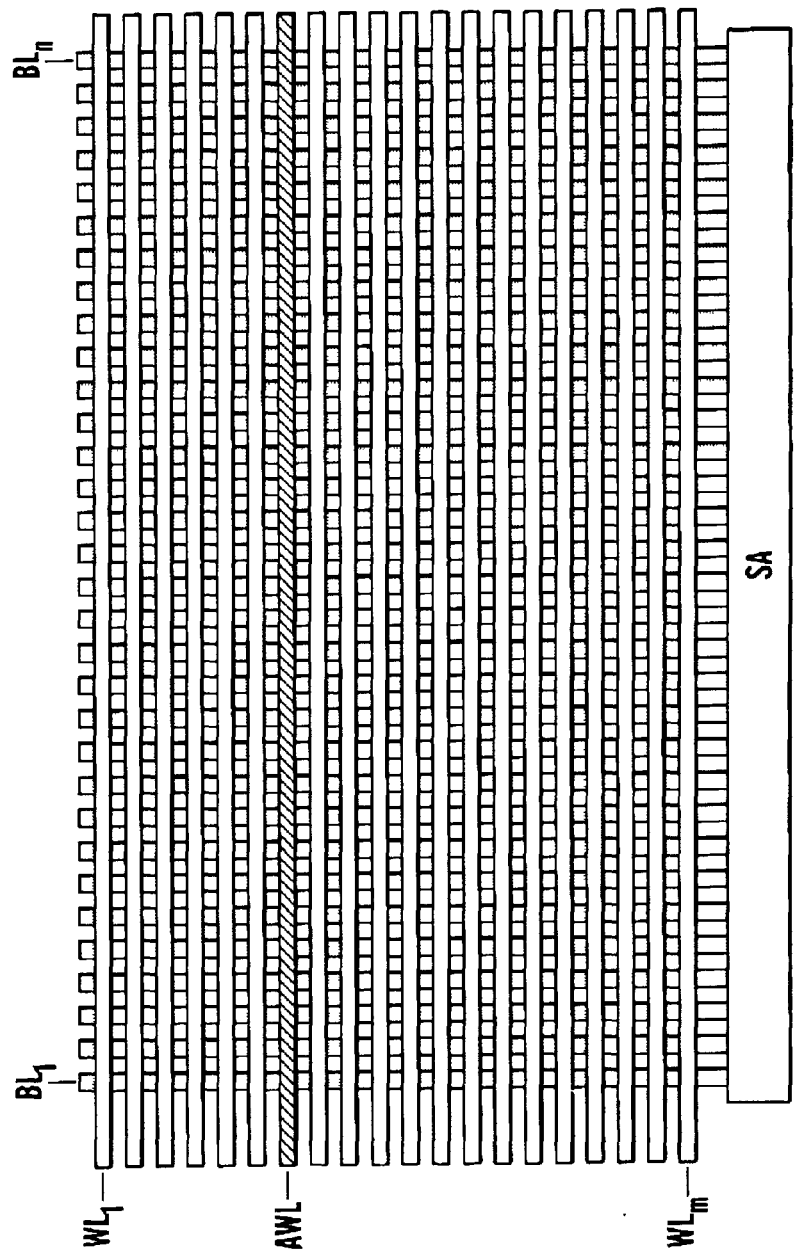
Figure 3:
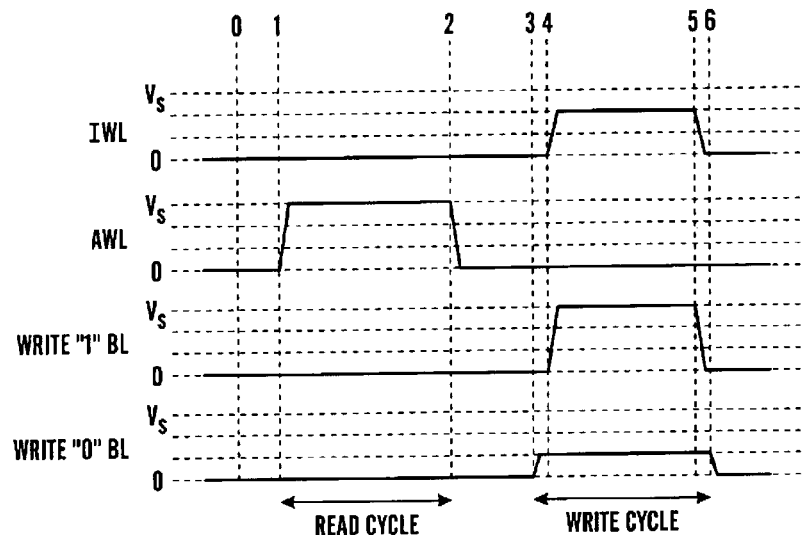
Figure 4:
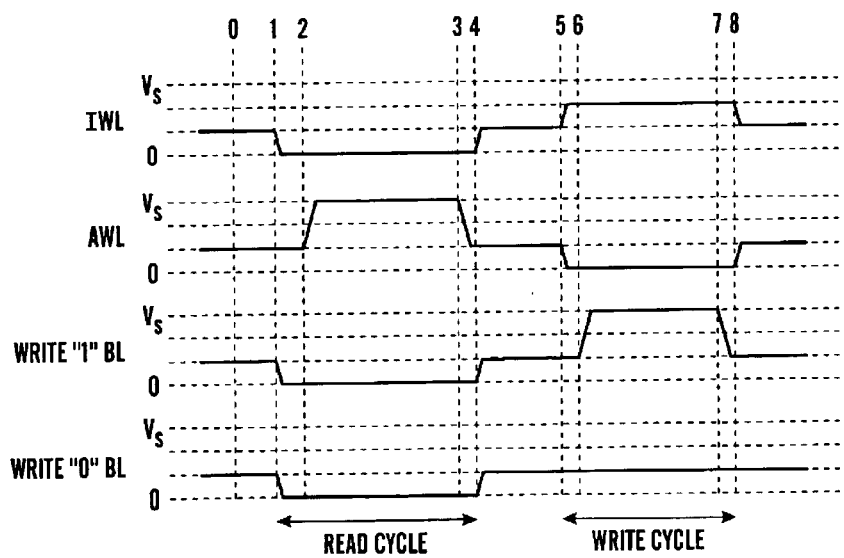

The invention shall now be explained in more detail with an exposition of the general background for the realization of passive matrix-addressable devices and how they are addressed according to the invention, and with discussion of exemplary embodiments, all with reference to the accompanying drawing figures, wherein FIG. 1 shows the hysteresis loop for a polarizable material, in casu a ferroelectric memory material, FIG. 2 schematically a passive matrix-addressable device, FIG. 3 a first embodiment of a voltage pulse protocol for full row read with a subsequent rewrite/refresh cycle, and FIG. 4 a second embodiment of a voltage pulse protocol for full row read with a subsequent rewrite/refresh cycle.

FIG. 1 shows the hysteresis loop of a polarizable material. Generally will ferroelectric and electret materials have hysteresis loops of this kind. In the hysteresis loop $-P_r$ and $+P_r$ respectively denote the positive and negative remanent polarization, while $P_s$ shown on the y axis is the so-called saturation polarization. On the x axis $-V_c$ and $+V_c$ respectively denote the positive and negative coercive voltage, while $V_s$ denotes a selected switching voltage larger than the coercive voltage $V_c$ and the value of ⅓ $V_s$ indicates according to the present invention a fractional voltage level which is a part of the voltage pulse protocol used and shall be discussed further below. If it is supposed that the polarizable material initially is unpolarized, it is polarized by applying a voltage, e.g. substantially larger than $V_c$ and preferably corresponding to $V_s$. The polarization will then move from 0 till it reaches the point $P_s$ on the hysteresis loop. This point indicates the ferroelectric or electret saturation polarization $P_s$ of the material and it is then of no use increasing the voltage further. When the applied voltage is removed, i.e. a zero potential now lies over the polarizable material, the polarization P will drift back along the hysteresis loop to the remanent or permanent polarization $P_r$ where the hysteresis loop crosses the y axis. Correspondingly, a large negative voltage $V_s$ can be applied for polarizing the material to the remanent polarization state $-P_r$. The polarization state can be changed from $+P_r$ to $-P_r$ by applying a voltage $-V_s$ and correspondingly the polarization state $-P_r$ is changed to $+P_r$ by applying a correspondingly large positive voltage $+V_s$. This conforms to the protocol for write and read in a passive matrix-addressable device which comprises a polarizable material of this kind and it shall be obvious that in order to achieve this the potential difference over the cell, i.e. the capacitor-like structure, must correspond to the applied voltage level $+V_s$ or $-V_s$, something which is achieved by setting a word line in question to this voltage and keeping one or more of the bit lines on zero potential. If only one of the cells connected with the active word line shall be written or read, it must be seen to that the potential of the remaining bit lines which contacts non-addressed cells are kept on the same voltage as the active word line, such that the potential difference over these cells thus becomes equal to zero.

FIG. 2 shows schematically an embodiment of the passive matrix-addressable device. A first electrode set consists of parallel electrodes WL which form word lines in the matrix. It may e.g. be m such word lines WL. A second electrode set consists of parallel electrodes BL which crosses the word lines WL orthogonally. The former are bit lines BL of the matrix and can be provided in a number n such that an m·n matrix is obtained. Each of the electrode sets is provided in respective parallel planes and the polarizable material can be provided as a global layer in sandwich between the electrode sets, possibly above the electrode sets if word lines WL and bit lines BL are provided in bridged arrangement with a mutual interlayer of insulation in the crossings. Thus a matrix-addressable device is obtained where each single cell now is defined in the active material which is located in or at the crossings between the word lines WL and the bit lines BL. This passive addressable matrix hence becomes a matrix with m·n addressable cells (the matrix may of course be square such that m=n). Both word lines and bit lines are connected to common detection means as well as driving and control circuits for selection and addressing. These are not shown, but their use in both active and passive matrix-addressable devices is well-known to persons skilled in the art and they are hence deleted in FIG. 2. Further is each of the bit lines connected with a detection means which in practice advantageously may be embodied as a sense amplifier SA.

In addressing a word line is selected and a determined voltage is applied thereto. This word line is shown as an active word line AWL in FIG. 2 while all the remaining word lines WL are denoted as inactive word lines (IWL). If now a potential difference exists between the active word line AWL and the bit lines BL which cross this word line, an addressing operation can be performed to the memory cell in the crossings between the word line AWL and the bit lines BL. In a so-called full row addressing (full row read) the same potential difference will be present over all cells which are connected to the active word line AWL, and for reading charges which flow in the bit lines are then detected by the respective detection means or the sense amplifiers SA In a preferred embodiment of the device for performing the method according to the invention the polarizable material is a ferroelectric polymer. Any ferroelectric polymer material can be used, including but not limited to polyvinylidene difluoride (PVDF). As further examples can be mentioned polyamides (odd nylons), cyanopolymers, copolymers of vinylidene difluoride (VDF) and trifluoroethylene (TrFE), polyureas, polytiureas, biopolymers such as polypeptides and cyanoethyl celluloses. The ferroelectric polymer thin film can be deposited by use of well-known methods such as spin coating, e.g. deposition of VDF-TrFE (75/25) copolymer from a suitable solvent, e.g. dimethyl formamide (DMF), cyclohexanone or methyl ethyl ketone (MEK).

Now various embodiments of the method according to the invention shall be discussed. A first embodiment is illustrated by the diagram in FIG. 3 which shows a voltage pulse protocol with voltage levels between 0 and $V_s$ and time markings for points in time and numbered from 0 to 6 at the upper edge of the figure as shown. According to the voltage pulse protocol in FIG. 3 all word lines WL and bit lines BL of the device are kept on a quiescent voltage equal to 0 when no addressing operation takes place, i.e. when no cell in the matrix is read or written to. During the read cycle the voltage $V_s$ between the time markings 1 and 2 is applied to an active word line AWL, while the inactive word lines IWL are kept at zero potential. In a cell which is in the remanent polarization state $+P_r$ the application of a large positive voltage $+V_s$ does not cause any essential change in the polarization state of the cell and there will in other words flow no charge in the bit line BL, possibly only a small charge which represents a difference between the saturation polarization $P_s$ and the remanent polarization $+P_r$ as shown in FIG. 1. If the cell on the contrary is in the remanent polarization state $-P_r$ the polarization state now according to the protocol will switch to $+P_r$ and a large charge current is obtained on the bit line BL and a high output signal to the detection means. If the positive polarization state $+P_r$ e.g. represents a logical 0 it is not necessary with any refresh or rewrite, but in the cell which was in the negative remanent polarization $-P_r$ the readout will cause switching to the positive remanent polarization state $+P_r$ and the logical value of the cell must be restored by a rewrite to the memory cell. This is achieved by keeping the active word line on zero potential and setting the indicated bit line on a potential which applies a voltage to the cell equal to $-V_s$. During the write cycle simultaneously all inactive word lines IWL are kept on $2V_s/3$ and inactive bit lines on $V_s/3$. Only the potential difference between an active word line AWL and a bit line BL activated for refresh will hence be equal to $V_s$, while all inactive word lines IWL are kept on the same potential, e.g. $2V_s/3$ and all inactive bit lines correspondingly on the potential $V_s/3$. The potential difference between inactive word line and active bit lines will hence be substantially less than $V_s$ and this contributes to reducing disturb voltages or capacitive couplings etc. in the matrix during the addressing operation for rewrite.

As will be seen, four voltage levels are used, viz. 0, $V_s/3$ and $2V_s/3$ and $V_s$ in the voltage pulse protocol in FIG. 3. The fractional levels of the voltage $V_s$, i.e. $V_s/3$ and $2V_s/3$ follows from a so-called voltage selection rule or scheme which is used for modifying the pulse protocol with selected voltage values between 0 and $V_s/3$ in order to reduce disturb voltages and sneak currents and other circumstances which may influence the polarization state of the memory cells in a detrimental manner. In the present case the selection rule used is a so-called ⅓ selection. It is possible to show that $V_s/3$ is the minimum average voltage level which can be present on all word and bit lines in the matrix during an addressing operation.

Regarding the theoretical background for the use of voltage pulse protocols and voltage selection rules reference can be made to the present applicant's Norwegian patent No. 312 699 which furnishes the theory of voltage pulse protocols and their use, independent of whether the addressing shall take place to individual cells or several cells in parallel in large passive matrix-addressable memory devices with a ferroelectric or electret memory material.

FIG. 4 shows another voltage pulse protocol according to the invention and with corresponding markings of points in time. Also this one uses four voltage levels from 0 to $V_s$ and the so-called ⅓ selection rule, but different from the protocol in FIG. 3 now all word lines and bit lines when no cell in the matrix are read or written are kept on a quiescent voltage $V_s/3$. This has the advantage that in an addressing operation for read or write this voltage level which in any case must be applied e.g. to an active word line AWL or an active bit line BL will be substantially less than $V_s$, e.g. at most amount to $2V_s/3$, and this has in its turn obvious advantages with regard to disturb voltages and sneak currents in the network and will simultaneously reduce the access time. Hence the active word line in the read cycle of the protocol switch from $V_s/3$ to $V_s$ at marking 2 and the bit lines from $V_s/3$ to zero voltage. Simultaneously also inactive word lines IWL are set to zero voltage such that there are no potential difference between inactive word lines IWL and inactive bit lines BL. After a read cycle which can be performed in parallel, the refresh takes place by setting all word and bit lines back to the quiescent voltage $V_s/3$ and in the cycle for rewrite or refresh a zero voltage is applied to the active word line AWL, while the active bit lines BL which addresses memory cells which shall be reset or refreshed are set at the potential $V_s$, implicitly with the appropriate polarity in order to cause the actual reset. The inactive bit lines, i.e. those which contact cells where no refresh shall take place, are kept on $V_s/3$, while inactive word lines IWL are set to $2V_s/3$. The potential difference between the inactive word lines and an inactive bit line will hence be $V_s/3$ and between the inactive word lines and an active bit line similarly $V_s/3$, while the potential difference between the active word line and the active bit line for rewrite of course now becomes equal to $V_s$ (possibly $-V_s$). The potential difference between an active word line AWL and an inactive bit line where no rewrite takes place is $V_s/3$.

The voltage pulse protocol in the embodiment shown in FIG. 3 provides a very simple read of the matrix-addressable device and this implies that the not shown driver circuits for the word lines and the bit lines WL;BL can be made relatively simple while the somewhat more complicated voltage pulse protocol shown in the embodiment in FIG. 4 requires that the potential on all word and bit lines are changed according to the protocol, but simultaneously now the immunity of the device to disturb voltages and sneak currents are improved to a substantial degree. It shall be understood that during the write cycle the actual potential on active bit lines can be positive and negative depending on which logic values that should be rewritten and the initial state of the cells after the destructive readout operation. It should also be noted that the time markings indicated in the figures for the timing sequences can be selected relatively freely and it can e.g. be the case that the time interval 2-1 and 4-3 in FIG. 4 for instance may be zero or negative, also that the time values will depend on the dynamic properties of the polarizable material, e.g. on the time constant of the hysteresis loop of the selected material. It is also to be understood that the absolute values of the voltage levels and the number of voltage levels itself according to the pulse protocol can be selected arbitrarily provided the conditions for performing a so-called full row read is achieved, namely a potential $V_s$ over each cell on the active word line and zero voltage over the non-addressed cells on the inactive word lines IWL. It shall also be possible to apply a substantially higher voltage than $V_s$ in order to activate the cells, without this being able to influence the remanent polarization state of the memory material. It shall in that connection also be noted that a phenomenon such as fatigue, i.e. a gradual reduction of the remanent polarization values of the memory cells, shall aggravate and cause problems for reading of the cells. Also so-called "imprint" will be manifest, i.e. the circumstance that the cell which for a long period of time has been in a particular polarization state will be disposed to maintain this polarization state and hence require high voltage or longer voltage pulses when a possible addressing of operation shall be performed.

Full row read hence is performed when all bit lines BL in the passive matrix are read during the same read cycle with the use of a suitable voltage pulse protocol. Only one of m word lines is active during the same period of time where all n bit lines BL are active. In order to achieve this each bit line in the matrix must be connected with a sense amplifier. Full row read can be used when a matrix for some reason is divided in a number of submatrices. The concept full row read is hence meant to include the circumstance wherein all cells on a complete word line in a submatrix is read during the same read cycle. The full row read provides a number of advantages compared with partial row read or readout of a single cell, namely a) during the read cycle all non-addressed cells are subjected to a zero potential, something which will reduce the number of disturb signals which could result in a loss of data content (logical value) as well as eliminate during a read operation all disturb which could cause background currents;

b) the data transfer rate will be the maximum rate which is allowed by the number of bit lines in a matrix or submatrix;

c) the readout voltage $V_s$ can be selected much higher that the coercive voltage without causing partial switching on non-addressed cells, which implies that switching speed shall be the highest possible switching speed for the polarizable material of the cells; and d) the readout scheme is compatible with large matrices and matrix groups.

For readout of data the potential difference between the active word line AWL and the bit lines BL is set on the potential $V_s$, which will cause charge to flow from the cells and to the contacting bit lines. The charge value (or current) depends on the polarization state of each cell and is detected by the sense amplifiers, one for each bit line. By using appropriate measuring circuitry, the logic state of each cell can hence be determined.

As stated in the introduction of the application, the passive matrix-addressable device may be a memory device and applied to storage of data such that the polarization state in each cell either represent a logical 1 or a logical 0. A corresponding device can also be used as a sensor device such that the logical values being stored in each cell are assigned to the value of each single sensor element of the sensor device. In principle there will, however, be no difference with regard to the method for reading and refreshing data stored in the cell in the one application or the other.

What is claimed is:

1. A method for reading a passive matrix-addressable device with individually addressable cells for storing a logical value as given by charge value set in a cell, wherein the device comprises electrically polarizable material exhibiting hysteresis, wherein the device comprises a first and a second electrode set with parallel electrodes which respectively form word lines and bit lines in the device, wherein the word line electrodes and the bit line electrodes are provided mutually orthogonal and contacting the polarizable material at opposite surfaces thereof, such that the cells of the device comprise capacitor-like structures defined in a volume of the polarizable material in or at the crossings between word lines and bit lines, wherein the cell in the device can be set to one of two polarization states or switched between these by applying a voltage $V_s$ larger than the coercive voltage $V_c$ of the polarizable material between a word line and a bit line addressing the cell, wherein each bit line is connected with detection means, wherein the method comprises a voltage pulse protocol with a read cycle such that each detection means during the read cycle detects charges flowing between its associated bit line and cells connected with this bit line, and wherein the method includes:

activating an active word line at least during a part of the read cycle by an applied potential which relative to the potential of all crossing bit lines at least corresponds to the voltage $V_s$;

enabling a parallel readout of the logical values stored in all individual cells connected with the active word line by detecting the charge values in the detection means; and controlling simultaneously electric potentials on all word and bit lines in a time-coordinated manner according to the voltage pulse protocol, said voltage pulse protocol comprising timing sequences for the electric potentials on all word and bit lines.

2. The method according to claim 1, wherein sense amplifiers are used as detection means.

3. The method according to claim 1, wherein four different voltage values in the control of the electric potentials are used.

4. The method according to claim 3, wherein the voltage values used are substantially 0, $V_s/3$, $2V_s/3$ and $V_s$.

5. An apparatus for performing a method for reading a passive matrix-addressable device with individually addressable cells, for storing a logical value as given by charge value set in a cell, wherein the device comprises electrically polarizable material exhibiting hysteresis, wherein the device comprises a first and a second electrode set with parallel electrodes which respectively form word lines and bit lines in the device, wherein the word line electrodes and the bit line electrodes are provided mutually orthogonal and contacting the polarizable material at opposite surfaces thereof, such that the cells of the device comprise capacitor-like structures defined in a volume of the polarizable material in or at the crossings between word lines and bit lines, wherein the cell in the device can be set to one of two polarization states or switched between these by applying a voltage $V_s$ larger than the coercive voltage $V_c$ of the polarizable material between a word line and a bit line addressing the cell, wherein each bit line is connected with detection means, wherein the method comprises a voltage pulse protocol with a read cycle such that each detection means during the read cycle detects charges flowing between its associated bit line and cells connected with this bit line, wherein the apparatus comprises:

control means, wherein the word lines and bit lines are connected with the control means which control electrical potentials on all word and bit lines in a time-coordinated manner and implements the voltage pulse protocol comprising timing sequences for the electric potentials on all word and bit lines, the control means being adapted for activating an active word line during at least a part of the read cycle, such that a potential which relative to the potential of all crossing bit lines at least corresponds to the voltage $V_s$ is applied to the active word line enabling a parallel readout of values stored in all individual cells connected with the active word line through the detection means.

6. The apparatus according to claim 5, wherein the electrically polarizable material is a ferroelectric polymer.

7. The apparatus according to claim 5, wherein the detection means include sense amplifiers.

8. A passive-matrix device, comprising:

an electrically polarizable material exhibiting hysteresis;

a plurality of word lines on a first side of the electrically polarizable material in a first direction;

a plurality of bit lines on a second side of the electrically polarizable material in a second direction, wherein individual cells of the passive-matrix device are formed in the electrically polarizable material at crossings of the word and bit lines;

a detection device connected to the plurality of the bit lines and configured to read data from a plurality of the cells; and a control device configured to control electric potentials on all word and bit lines according to a voltage pulse protocol to enable the detection device to perform a parallel reading of data in all cells corresponding to an active word line, wherein the active word line is a selected word line among the plurality of word lines.

9. The passive-matrix device of claim 8, wherein the detection device comprises a plurality of sense amplifiers.

10. The passive-matrix device of claim 9, wherein a number of sense amplifiers is equal to a number of bit lines.

11. The passive-matrix device of claim 8, wherein the voltage pulse protocol includes applying multiple voltage levels to the word and bit lines in a time-coordinated matter.

12. The passive-matrix device of claim 11, wherein the voltage pulse protocol includes a read cycle and a write cycle such that during the write cycle, original data are written back to cells that underwent polarization changes during the read cycle.

13. The passive-matrix device of claim 12, wherein the multiple voltages substantially range from 0 to $V_s$, wherein $V_s$ is larger than a coercive voltage $V_c$ of the electrically polarizable material.

14. The passive-matrix device of claim 13, wherein during the read cycle, the electric potential applied to the active word line is substantially $V_s$ and the electric potential applied to inactive word lines is substantially 0, wherein the inactive word lines are word lines other than the active word line.

15. The passive-matrix device of claim 14, wherein during the write cycle, the electric potential applied to the active word line is substantially 0 and the electric potential applied to active bit lines is substantially $V_s$, wherein the active bit lines are bit lines corresponding to the cells to which original data are to be written back.

16. The passive-matrix device of claim 15, wherein during the write cycle, the electric potentials applied to inactive bit lines are such that the electric potential applied to these cells is insufficient to cause a polarization change, wherein the inactive bit lines are bit lines not corresponding to the cells to which original data are to be written back.

17. The passive-matrix device of claim 16, wherein during the write cycle, the electric potentials applied to the inactive word lines is set to reduce differential potentials applied between the inactive word lines and the active bit lines.

18. The passive-matrix device of claim 17, wherein during the write cycle, the electric potential applied to the active word line is substantially 0, the electric potential applied to the inactive word lines is substantially $\frac{2}{3} V_s$, the electric potential applied to the active bit lines is substantially $V_s$, and electric potential applied to the inactive bit lines is substantially $\frac{1}{3} V_s$.

19. The passive-matrix device of claim 18, wherein a quiescent potential applied to one or more of the word lines and bit lines is non-zero, wherein the quiescent potential is an electric potential applied during non-read and non-write times of the voltage pulse protocol.

20. The passive-matrix device of claim 19, wherein the quiescent potential is substantially $\frac{1}{3} V_s$.

* * * * *